(12) United States Patent
Vackar

(10) Patent No.: US 6,317,348 B1
(45) Date of Patent: Nov. 13, 2001

(54) UPS CHASSIS DESIGN HAVING AN INTERNAL SUPPORT STRUCTURE

(75) Inventor: Mark A. Vackar, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 0 days.

(21) Appl. No.: 09/740,005

(22) Filed: Dec. 20, 2000

(51) Int. Cl.7 .................................................... H02M 1/00
(52) U.S. Cl. .............................................................. 363/144
(58) Field of Search ................................... 363/141, 144, 363/146; 361/332, 346, 381, 392, 393, 394

(56) References Cited

U.S. PATENT DOCUMENTS 4,772,999 * 9/1988 Fiorina et al. ....................... 363/141
5,701,244 * 12/1997 Emmert et al. ...................... 363/146
5,995,400 * 11/1999 Park et al. ............................ 363/146

* cited by examiner

Primary Examiner—Matthew Nguyen
(74) Attorney, Agent, or Firm—Banner & Witcoff, Ltd.

(57) ABSTRACT

A modular UPS unit with an internal central support structure. Each module can be removed from the structure independent of the others, permitting hot swapping of the modules. The internal support structure simplifies the manufacture of the unit, minimizes the size, and the unit is easily expanded in the field. The uninterrupted power supply has a base section, a central support structure and uninterrupted power supply modules. The central support structure is modular and can be connected to the base. Additional modular sections can be added to the central support section. The modular sections are formed from panels having male fasteners and I/O connectors on the front of each panel. The uninterrupted power supply modules have female fasteners for connecting with the male fasteners on the panels and I/O connectors for connecting to the I/O connectors on the panel.

29 Claims, 4 Drawing Sheets

UPS CHASSIS DESIGN HAVING AN INTERNAL SUPPORT STRUCTURE

FIELD OF THE INVENTION

The invention relates to a chassis for a uninterruptible power supply (UPS), and more particularly to a modular UPS unit with an internal support structure which simplifies the construction of the UPS unit and allows the UPS unit to be easily expanded.

BACKGROUND OF THE INVENTION

An uninterruptible power supply, well known as a UPS, is typically used as a buffer between commercially supplied power and an electrical load, such as a computer, blood analyzer or other electronic equipment. If line voltage is interrupted, power to the load is maintained for a limited amount of time to operate the load during the interruption or to provide time to properly shut down the load without resulting damage. An on-line UPS typically comprises a converter, inverter, and battery charger. The UPS converts the commercially supplied AC power to DC power and then back to AC power. This conversion isolates the load equipment from spikes and sags in the commercially supplied power and corrects variances in line voltages. DC power is used to charge a battery. The battery can then be used to supply AC power to the load when the commercially supplied power is interrupted In commercial applications, loads may change over time. As computer networks are expanded the load on the UPS increases. In order to meet this increase in demand, either a larger UPS is needed or a plurality of modular UPS units can be connected together to meet the required power level.

Known designs for a modular UPS have utilized one of two basic concepts. The first concept is to make each module an independent chassis. The modules can then be stacked or piled next to each other in order to make the necessary electrical connections. The problem with this concept is that it is difficult to move the unit and changing a module may require modules to be disconnected during the operation of the system. The second concept of designing a modular UPS has been to build a freestanding chassis that is essentially a large receptacle for the modules. This design solves the problems of mobility and service, but increases the size of the unit, makes the unit more difficult to manufacture, and limits field expandability. Thus, there is a need for a modular UPS unit that is easy to maintain, expandable and easy to manufacture.

SUMMARY OF THE INVENTION

In view of the foregoing background, it is therefore an object of the invention to provide a modular UPS unit in response to, and in satisfaction of, the aforementioned needs. The invention is a modular UPS unit with an internal support structure. By utilizing a central support structure, the UPS unit is mobile and each module can be removed from the structure independent of the others, thus allowing for hot swapping of the modules. By using an internal support structure rather than an external structure, the manufacture of the unit is greatly simplified, the size is kept to a minimum, and the unit can be easily expanded in the field.

According to one embodiment of the invention, an uninterrupted power supply chassis is disclosed. The uninterrupted power supply comprises a base section, a central support structure and uninterrupted power supply modules. The base section has a top and bottom wherein the top of the base section has a plurality of different slots for accepting a plurality of different protrusions. The central support structure is comprised of at least a first pair of panels which are fastened together back to back, each panel has a front, back, top and bottom, wherein the plurality of protrusions are provided on the bottom of each panel and the plurality of different slots are provided on the top of each panel so that the first pair of panels can be connected to the base and subsequent pairs of panels can be connected to existing pairs of panels, the panels having male fasteners and I/O connectors on the front of each panel. The uninterrupted power supply modules have female fasteners for connecting with the male fasteners on the panels and I/O connectors for connecting to the I/O connectors on the panel.

According to another embodiment of the invention, an uninterrupted power supply chassis is disclosed. The uninterrupted power supply comprises a base section, a central support structure and uninterrupted power supply modules. The base section has a top and bottom wherein the top of the base section has a plurality of different slots for accepting a plurality of different protrusions. The central support structure is comprised of at least a first pair of panels which are fastened together back to back, each panel has a front, back, top and bottom, wherein the plurality of protrusions are provided on the bottom of each panel and the plurality of different slots are provided on the top of each panel so that the first pair of panels can be connected to the base and subsequent pairs of panels can be connected to existing pairs of panels, the panels having fasteners and I/O connectors on the front of each panel. The uninterrupted power supply modules have fasteners for connecting with the fasteners on the panels and I/O connectors for connecting to the I/O connectors on the panel.

BRIEF DESCRIPTION OF THE DRAWINGS

The foregoing summary of the invention, as well as the following detailed description of preferred embodiments, is better understood when read in conjunction with the accompanying drawings, which are included by way of example, and not by way of limitation with regard to the claimed invention:

DETAILED DESCRIPTION

The invention will now e described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
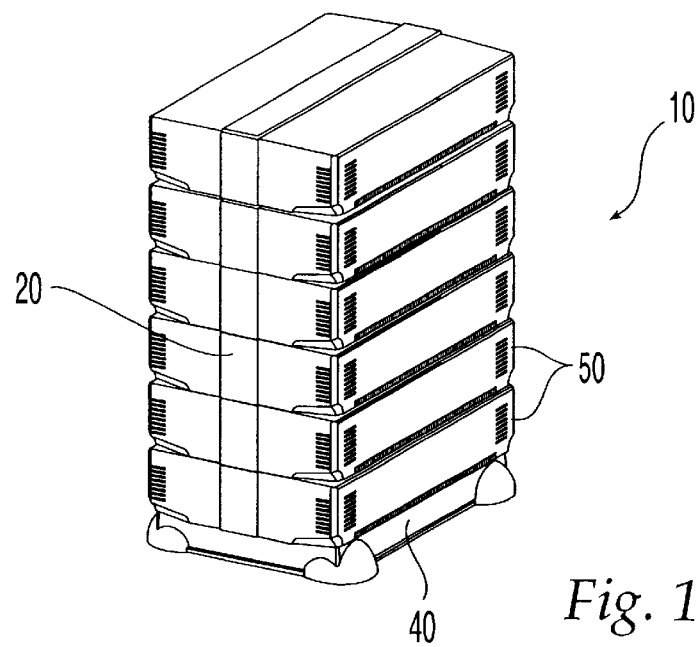
FIG. 1 is a block diagram of a UPS system according to one embodiment of the invention.
Figure 2:
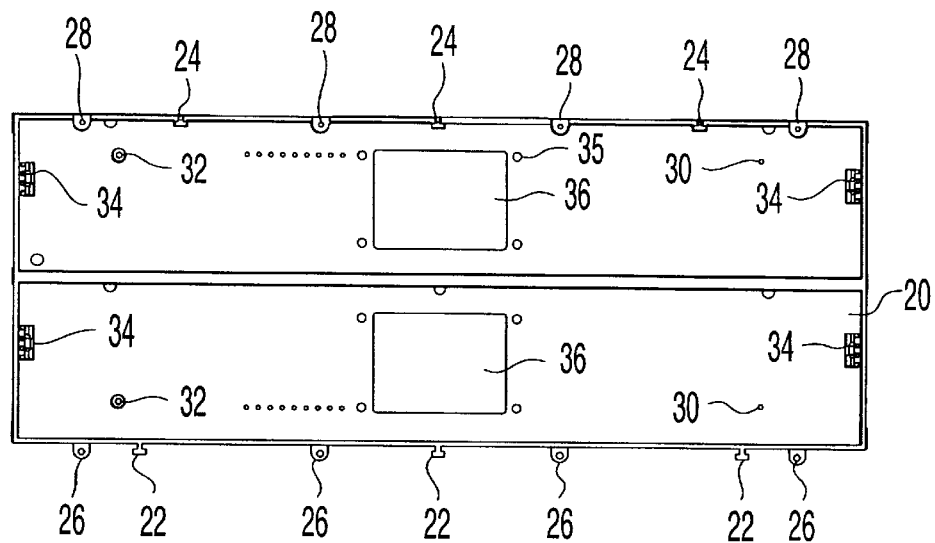
FIG. 2 is a front view of a modular piece of the internal chassis of the UPS unit according to one embodiment of the invention.
Figure 3:
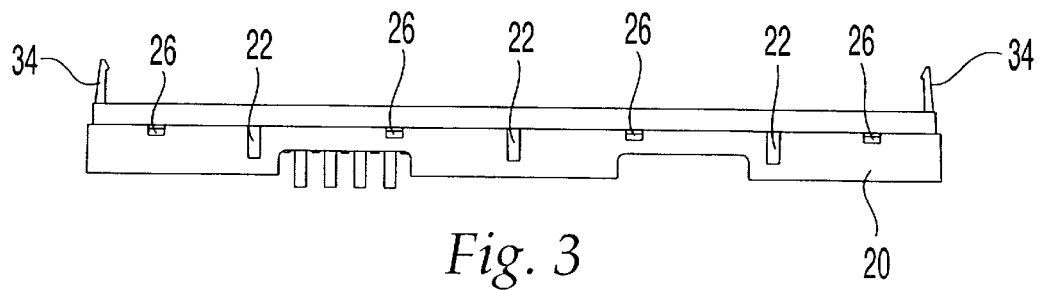
FIG. 3 is a bottom view of the modular piece of the internal chassis of the UPS unit illustrated in FIG. 2 according to one embodiment of the invention.
Figure 4:
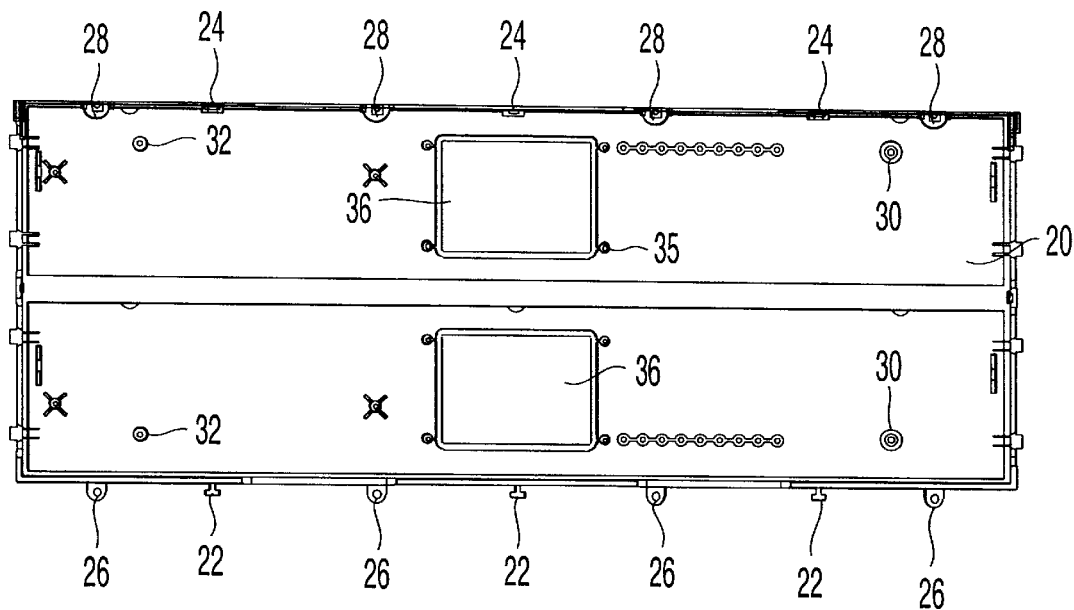
FIG. 4 is a back view of the modular piece of the internal chassis of the UPS unit illustrated in FIG. 2 according to one embodiment of the invention.
Figure 5:
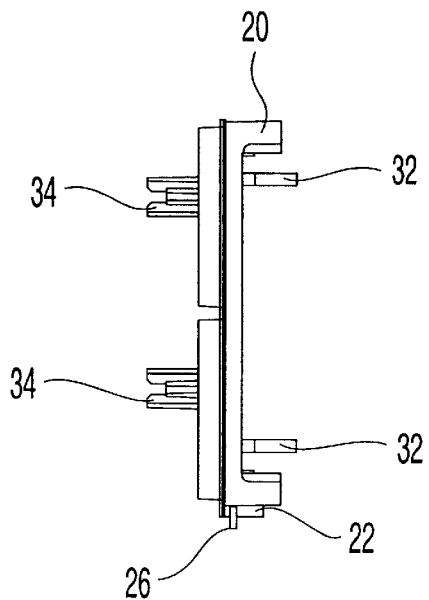
FIG. 5 is an end view of the modular piece of the internal chassis of the UPS unit illustrated in FIG. 2 according to one embodiment of the invention.

FIG. 1 is a block diagram of a UPS system 10 according to one embodiment of the invention. The UPS system 10 comprises a plurality of panels 20, a base 40 and a plurality of modular UPS units 50. The plurality of panels 20 is connected together as described below to form an internal chassis or central support structure. By utilizing a central support structure, the UPS system is mobile and each UPS modular unit 50 can be removed from the central support structure independent of the other modular UPS units, thus allowing for hot swapping of the modular UPS units. By using the central support structure, the manufacture of the UPS system is greatly simplified, the size of the system is kept to a minimum, and the UPS system can be easily expanded in the field.

Referring now to FIGS. 2–5, the internal structure of the UPS unit comprises a plurality of panels 20 which can be connected together back to back to form a fist section and then top to bottom to form additional sections which are attached to the first section. The panel 20 has a plurality of T-shaped protrusions 22 spaced apart along the bottom of the panel 20. A plurality of screw tabs is also spaced apart along the bottom of the panel 20. The top of the panel 20 has a plurality of T-shaped slots 24 and screw slots 28. The T-shaped slots 24 and the screw slots 28 are aligned with the T-shaped protrusions 22 and the screw tabs 26, respectively, so that the T-shaped slots 24 on the top of a panel 20 will receive the T-shaped protrusions 22 on the bottom of a second panel 20, and the screw tab slots 28 on the top of the first panel will receive the screw tabs 26 on the bottom of the second panel 20. A T-shaped protrusion 22 is inserted into the T-shaped slot 24 and slides forward locking into the narrow portion of the slot. A screw is then placed through the screw tab 26 and treaded into a receiving boss in the screw tab slot. It will be understood that the invention could also only use either the screw tabs or the T-shaped protrusions as the fastening means for stacking panels on top of each other. Furthermore, it will be understood that other shaped protrusions and fasteners could also be used to fasten panels together on top of each other. For example, male fasteners could be located on the bottom of each panel and female fasteners could be located on the top of each panel, or vice versa, in such a manner that the male and female fasteners fasten panels on top of each other.

Figure 6:
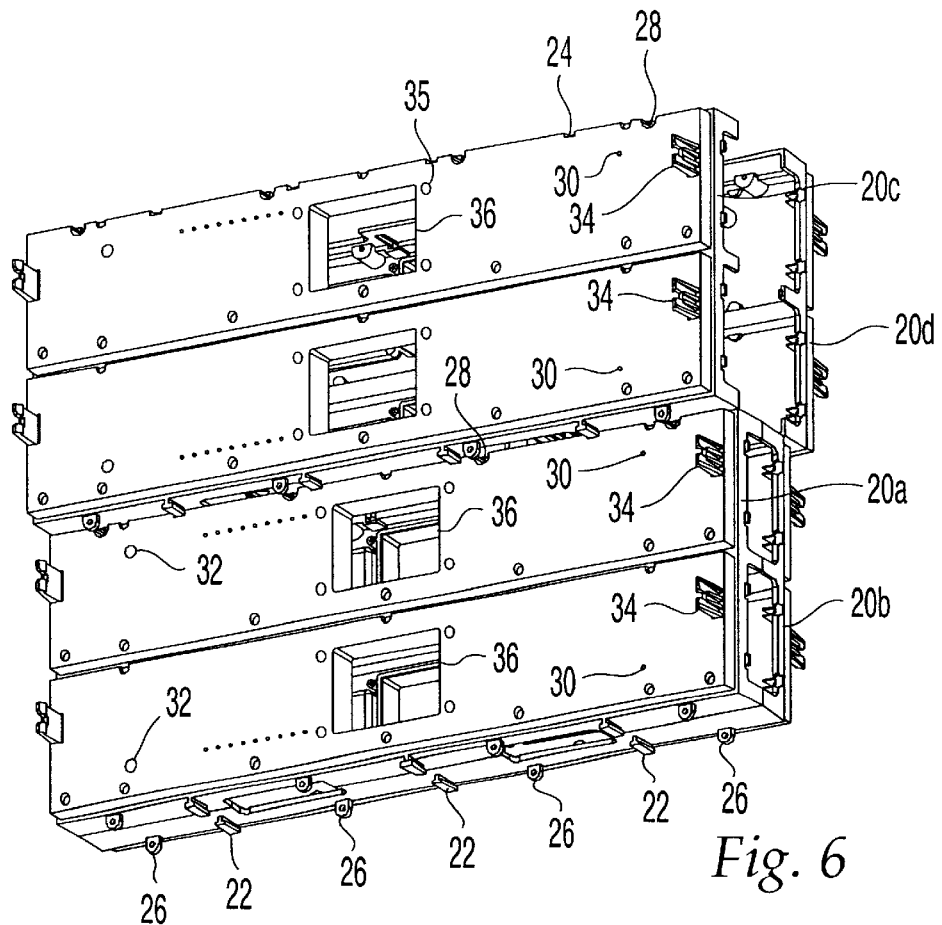
FIG. 6 is a perspective view of the modular pieces of the internal chassis being connected together according to one embodiment of the invention.

Each panel 20 also includes a plurality of screw holes 30, 32 or some other fastening means, such as male/female connectors for fastening two panels together back to back as illustrated in FIG. 6. The two panels 20a and 20b are attached together, for example, by at least one screw inserted from each side into screw holes 30, 32. In this embodiment, two screws are inserted from each side but the invention is not limited thereto.

Each panel 20 also includes I/O connectors 36 to electrically connect each modular UPS unit to the UPS chassis. In addition, each panel 20 has a plurality of male fasteners 34 to which at least one modular UPS unit is attached. It will be understood that other fasteners can also be used instead of male/female connectors to physically connect each modular UPS unit to the UPS chassis. While the embodiment, illustrated in FIGS. 2–5, shows that two modular UPS units can be connected to each panel, it will be understood the each panel could be manufactured in such a manner so that any number of modular UPS units could be connected to each panel.

The I/O connectors 36 are surrounded by four mounting holes 35 to which metal plates (not shown) may be attached. The metal plates support output connecters for electronic modules or battery modules.

As described above, a plurality of panels can be connected back to back to form a chassis section 37 as illustrated in FIG. 6. When two panels are connected back to back, the screw tabs 26 on the bottom of each panel are aligned with each other and the T-shaped protrusions 22 on each panel are aligned with each other as illustrated in FIG. 6. Likewise, the tab screw slots 28 on the top of each panel are aligned with each other and the T-shaped slots 24 on the top of each panel are aligned with each other.

FIG. 6 also illustrates how a second section of panels 39 can be attached to a first section of panels 37. Panel 20c is first attached to panel 20a by sliding the screw tabs 26 and the T-shaped protrusions 22 on the bottom of panel 20c into the corresponding screw tab slots 28 and the T-shaped slots 24 on the top of panel 20a. Then panel 20d is attached to panel 20b by sliding the screw tabs 26 and the T-shaped protrusions 22 on the bottom of panel 20d into the corresponding screw tab slots 28 and the T-shaped slots 24 on the top of panel 20b. Then a matching pair of screws 38 are inserted from each side to fasten together panels 20c and 20d. Screws are then inserted into the screw tabs 26 to securely fasten section 37 to section 39. It will be understood in the art that the T-shaped protrusions 22 and the screw tabs 26 could be located on the top of each panel and the T-shaped slots 24 and the screw tab slots 28 could be located on the bottom of each panel without departing from the spirit and scope of the invention.

Figure 7:
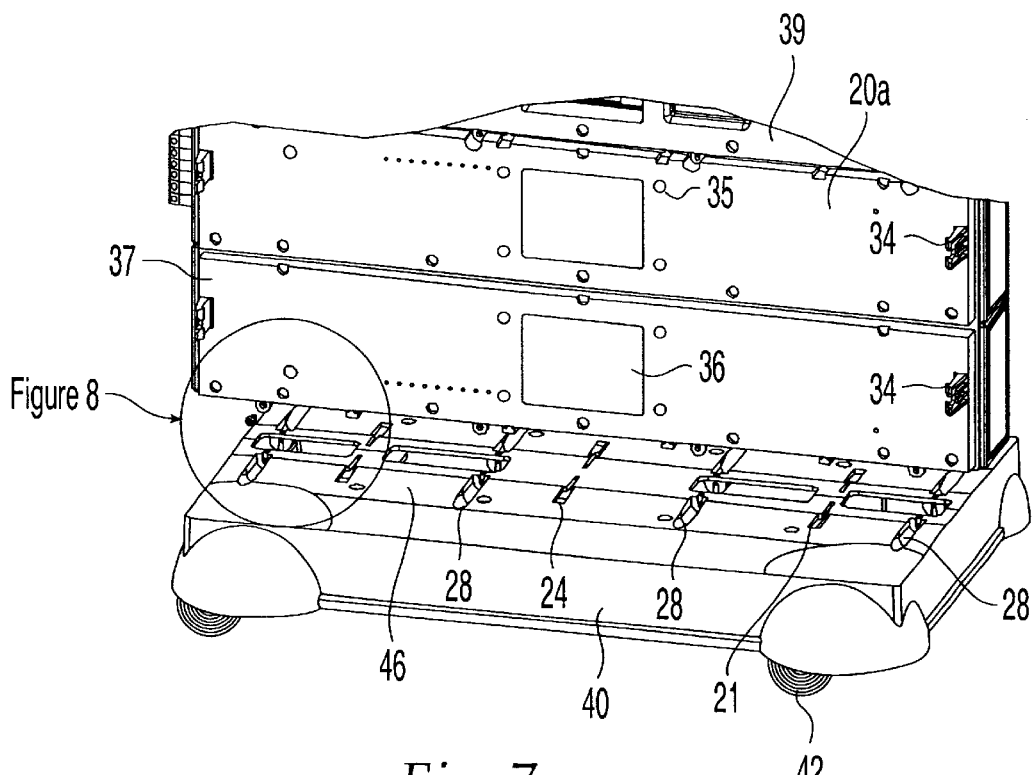
FIG. 7 is a perspective view of the internal chassis being connected to the base according to one embodiment of the invention.
Figure 8:
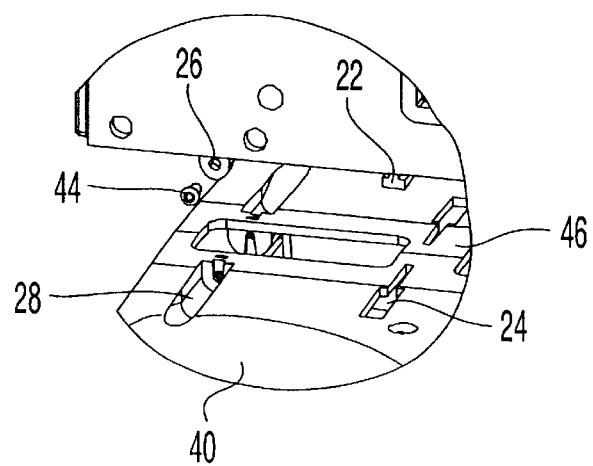
FIG. 8 is a partial exploded view of FIG. 7 according to one embodiment of the invention.

The connection of the central support structure to the base 40 will now be described with reference to FIGS. 7 and 8. The base 40 can be optionally supplied with wheels 42 so as to improve the mobility of the UPS system 10. The base is provided with an upper surface 46 onto which section 37 is to be connected. The upper surface 46 has a plurality of T-shaped slots 24 and screw tab slots 28 which correspond the T-shaped protrusions 22 and the screw tabs 26 on each of the panels 20. Panel 20a is first attached to the base by sliding the screw tabs 26 and the T-shaped protrusions 22 on the bottom of panel 20a into the corresponding screw tab slots 28 and the T-shaped slots 24 on the upper surface 46 of the base 40. Then panel 20b (not shown) is attached to base 40 by sliding the screw tabs 26 and the T-shaped protrusions 22 on the bottom of panel 20b into the corresponding screw tab slots 28 and the T-shaped slots 24 on the upper surface 46 of the base 40. Then a matching pair of screws 38 are inserted from each side to fasten together panels 20a and 20b. Screws 44 are then inserted into the screw tabs 26 to securely fasten section 37 to the base 40. It will be understood in the art that the T-shaped protrusions 22 and the screw tabs 26 could be located on the upper surface of the base 40 and the T-shaped slots 24 and the screw tab slots 28 could be located on the bottom of each panel without departing from the spirit and scope of the invention.

Figure 9:
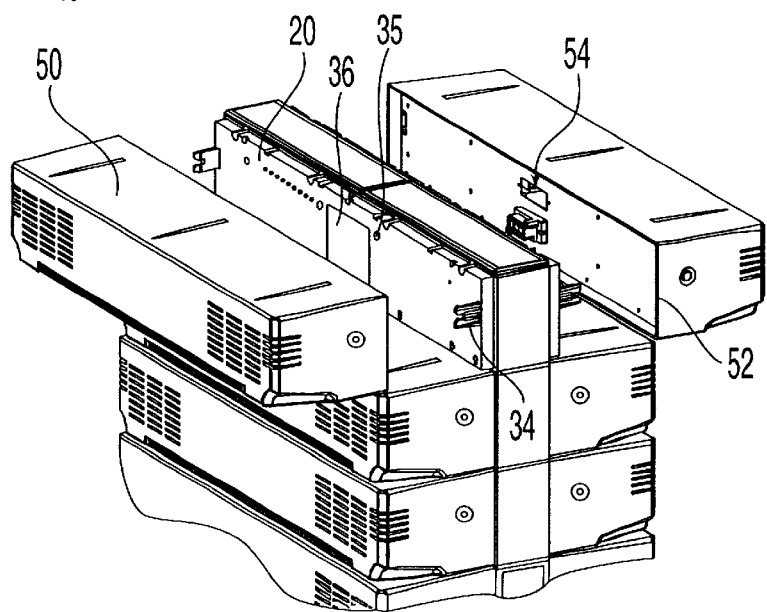
FIG. 9 is a perspective view of UPS modules being connected to the internal chassis according to one embodiment of the invention.

FIG. 9 illustrates how each modular UPS unit 50 is attached to the central support structure. As mentioned above, each panel has a plurality of male fasteners or clips 34. Each modular UPS unit 50 has a plurality of female fasteners or latches 52 arranged so that they align with the male fasteners on a section of each panel. The modular UPS units are attached to the central support structure by a pair of clips 34 on each panel that snap into matching latches 52 inside each modular UPS unit 50. It will be understood that other types of fasteners could be used instead of clips and latches to fasten each modular UPS unit to the central support structure. For example, the clips could be provided on each modular UPS system and the corresponding latches can be provided in each panel. In addition, each modular UPS unit 50 has input/output connectors 54 which connect to the input/output connectors 36 on the central support structure to electrically connect the modular UPS units 50 to the UPS system 10.

Although a preferred embodiment of the invention has been described in the context of a UPS system, it is to be understood that the invention can be used in other systems made up of modular components in which it may be advantageous to provide an expandable chassis with an internal support structure. Additionally, while the invention has been illustratively described in its preferred form, it is not intended to limit the scope of the claims that follow the specifics of that design form, inasmuch as variations equivalent thereto are feasible without departing from the novel inventive concepts involved. These and other variations are contemplated to fall within the scope of the claims that follow.

I claim:

1. An uninterrupted power supply system comprising:
    a base section, with a top and bottom wherein the top of said base section has a plurality of different slots for accepting a plurality of different protrusions;
    a central support structure comprising at least a first pair of panels which are fastened together back to back, each panel has a front, back, top and bottom, wherein said plurality of protrusions are provided on the bottom of each panel and said plurality of different slots are provided on the top of each panel so that said first pair of panels can be connected to said base and subsequent pairs of panels can be connected to existing pairs of panels, said panels having male fasteners and I/O connectors on the front of each panel;
    uninterrupted power supply modules having female fasteners for connecting with said male fasteners on said panels and I/O connectors for connecting to the I/O connectors on said panel.

2. The uninterrupted power supply system according to claim 1, wherein said plurality of different protrusions comprise T-shaped protrusions and screw tabs.

3. The uninterrupted power supply system according to claim 1, wherein each panel can be connected to two uninterrupted power supply modules.

4. The uninterrupted power supply system according to claim 1, wherein wheels are attached to the bottom of said base.

5. The uninterrupted power supply system according to claim 1, wherein said uninterrupted power supply modules are attached to each panel by a pair of clips located on said panel that snap into matching latches inside said uninterrupted power supply modules.

6. The uninterrupted power supply system according to claim 2, wherein said plurality of slots are slots configured to receive the T-shaped protrusions and screw tabs.

7. The uninterrupted power supply system according to claim 6, wherein said T-shaped protrusions are inserted into appropriate slots so that the T-shaped protrusions slide forward and lock into a narrow portion of each slot.

8. The uninterrupted power supply system according to claim 1, wherein each pair of panels are fastened together by screws.

9. The uninterrupted power supply system according to claim 6, wherein screws are treaded trough said screw tabs and into a receiving boss of the slot.

10. An uninterrupted power supply system comprising:
    a base section, with a top and bottom wherein the top of said base section has a plurality of different slots for accepting a plurality of different protrusions;
    a central support structure comprising at least a first pair of panels which are fastened together back to back, each panel has a front, back, top and bottom, wherein said plurality of protrusions are provided on the bottom of each panel and said plurality of different slots are provided on the top of each panel so that said first pair of panels can be connected to said base and subsequent pairs of panels can be connected to existing pairs of panels, said panels having fasteners and I/O connectors on the front of each panel;
    uninterrupted power supply modules having fasteners for connecting with said fasteners on said panels and I/O connectors for connecting to the I/O connectors on said panel.

11. The uninterrupted power supply system according to claim 10, wherein said plurality of different protrusions comprise T-shaped protrusions and screw tabs.

12. The uninterrupted power supply system according to claim 10, wherein each panel can be connected to two uninterrupted power supply modules.

13. The uninterrupted power supply system according to claim 10, wherein wheels are attached to the bottom of said base.

14. The uninterrupted power supply system according to claim 10, wherein said uninterrupted power supply modules are attached to each panel by a pair of clips located on said panel that snap into matching latches inside said uninterrupted power supply modules.

15. The uninterrupted power supply system according to claim 11, wherein said plurality of slots are slots configured to receive the T-shaped protrusions and screw tabs.

16. The uninterrupted power supply system according to claim 15, wherein said T-shaped protrusions are inserted into appropriate slots so that the T-shaped protrusions slide forward and lock into a narrow portion of each slot.

17. The uninterrupted power supply system according to claim 10, wherein each pair of panels are fastened together by screws.

18. The uninterrupted power supply system according to claim 15, wherein screws are treaded trough said screw tabs and into a receiving boss of the slot.

19. The uninterrupted power supply system according to claim 10, wherein said uninterrupted power supply modules are attached to each panel by a pair of latches located on said panel that snap into matching clips inside said uninterrupted power supply modules.

20. An uninterrupted power supply system comprising:
    a base section, with a top and bottom wherein the top of said base section has a plurality of different protrusions;
    a central support structure comprising at least a first pair of panels which are fastened together back to back, each panel has a front, back, top and bottom, wherein said plurality of protrusions are provided on the top of each panel and a plurality of different slots for accepting said plurality of different protrusions are provided on the bottom of each panel so that said first pair of panels can be connected to said base and subsequent pairs of panels can be connected to existing pairs of panels, said panels having fasteners and I/O connectors on the front of each panel;

uninterrupted power supply modules having fasteners for connecting with said fasteners on said panels and I/O connectors for connecting to the I/O connectors on said panel.

21. The uninterrupted power supply system according to claim 20, wherein said plurality of different protrusions comprise T-shaped protrusions and screw tabs.

22. The uninterrupted power supply system according to claim 20, wherein each panel can be connected to two uninterrupted power supply modules.

23. The uninterrupted power supply system according to claim 20, wherein wheels are attached to the bottom of said base.

24. The uninterrupted power supply system according to claim 20, wherein said uninterrupted power supply modules are attached to each panel by a pair of clips located on said panel that snap into matching latches inside said uninterrupted power supply modules.

25. The uninterrupted power supply system according to claim 21, wherein said plurality of slots are slots configured to receive the T-shaped protrusions and screw tabs.

26. The uninterrupted power supply system according to claim 25, wherein said T-shaped protrusions are inserted into appropriate slots so that the T-shaped protrusions slide forward and lock into a narrow portion of each slot.

27. The uninterrupted power supply system according to claim 20, wherein each pair of panels are fastened together by screws.

28. The uninterrupted power supply system according to claim 25, wherein screws are treaded trough said screw tabs and into a receiving boss of the slot.

29. The uninterrupted power supply system according to claim 20, wherein said uninterrupted power supply modules are attached to each panel by a pair of latches located on said panel that snap into matching clips inside said uninterrupted power supply modules.

* * * * *